United States Patent Office
3,198,633
Patented Aug. 3, 1965

3,198,633
PHOTOPOLYMERIZABLE ELEMENTS AND TRANSFER PROCESSES

Abraham Bernard Cohen, Springfield, and Ray Henry Luebbe, Jr., Fair Haven, N.J., assignors to E. I. du Pont de Nemours and Company, Wilmington, Del., a corporation of Delaware No Drawing. Filed Dec. 1, 1961, Ser. No. 156,518
11 Claims. (Cl. 96—28)

This invention relates to photopolymerizable compositions and to image-yielding elements and more particularly to such elements embodying photopolymerizable components. The invention also relates to processes of image reproduction using such elements.

Photosensitive layers for the formation of lithographic plates are known. These layers are very thin and the unsaturated compounds used therein are photosensitive, colored and strongly absorptive of actinic light, usually containing a cinnamyl group. Photopolymerizable elements for the production of printing reliefs having a photopolymerizable layer 3–250 mils thick and containing a colored dye or pigment are also known (cf. Plambeck U.S. Patent 2,791,504). However, the colorant must not absorb a preponderance of the radiation to which the initiator is sensitive because the colorant would prevent addition polymerization to the required relief height.

An object of this invention is to provide new photopolymerizable compositions, image-yielding elements and more particularly such elements that contain photopolymerizable compounds. Another object is to provide such elements which do not require post-exposure chemical treatment but which are amenable to dry processing. A further object is to provide processes for forming dye images by using such elements. Still further objects will be apparent from the following description of the invention.

The photopolymerizable compositions of this invention comprise:

(1) An addition polymerizable non-gaseous, ethylenically unsaturated compound containing at least one terminal ethylenic group ($CH_2$=C<) having a boiling point above 100° C. at normal atmospheric pressure and being capable of forming a high polymer by free-radial initiated, chain-propagating addition polymerization, (2) A free-radical generating addition polymerization initiator activatable by actinic radiation, and (3) At least one dye, e.g., a basic dye in molecularly associated form such that upon molecular dissociation the extinction coefficient increases by at least 50% in one of the wavelength regions of intense dye absorption and where said initiator absorbs actinic raditation. In general, constituent (2) is present in an amount from 0.001% to 10%, preferably 0.01% to 10%, and constituent (3) is present in an amount of 0.01% to 10%, by weight of constitutent (1).

The preferred compositions are solid below 18° C., have a stick temperature above 18° C. and below 220° C. and in addition contain (4) A compatible viscosity modifying agent preferably a thermoplastic compound which is solid at 50° C. Such agents include filler materials, both inorganic and polymeric, plasticizers and high-boiling solvents. Constituents (4) and (1) can be present in amounts from 3 to 97 and 97 to 3 parts by weight, respectively, and constituents (2) and (3) in the percentages specified above but based on the total weight of constituents (4) and (1).

The image-yielding elements of the invention comprise a support, e.g. a sheet bearing a photopolymerizable layer having a thickness of 0.00005 to 0.005, preferably 0.0001 to 0.001 inch, solid below 18° C. having a stick temperature above 18° C. and below 220° C. and comprising constituents (1), (2), (3) and (4) in the amounts given above.

In the foregoing compositions and elements, the dye, in general, should have an extinction coefficient of at least 1000 and the initiator should have as its actinic region for photopolymerization radiation in the range 380 to 700 millimicrons. Also the photopolymerizable compositions and layers may contain a polymerization inhibitor in the amount of about 0.001% to 10% by weight of the components. The supports are preferably flexible hydrophobic film or paper sheets.

In its broader aspects, the process of the invention comprises exposing with actinic radiation, imagewise, a stratum of a photopolymerizable composition as described above and especially a solid stratum having a a thickness as given above and a stick temperature above 18° C. until polymerization with an accompanying increase in stick temperature of said unsaturated compound takes place in the exposed areas with substantially less polymerization and less increase in stick temperature in the underexposed, complementary, adjoining coplanar image areas, to provide a difference of at least 10° C. in the stick temperature between said exposed and underexposed areas. The dyed image can then be amplified by deaggregating the dye. This can be done in various ways, e.g., by heating, by transfer to an image-receptive support, and heating while in contact or subsequent thereto.

In a preferred embodiment of the invention, a photopolymerizable compound and a photoinitiator are present in the stratum so that imagewise exposure of the element results, through polymerization, in the imagewise increase of stick temperature of the stratum. By pressing the stratum to a paper support at the operating temperature, an image corresponding to the underexposed unhardened areas of the stratum is transferred to the surface of the paper support whereupon the basic dye included within the transferred material undergoes an increase in extinction coefficient in a part of its intense visible spectrum. By such an exposure and transfer operation, at least one copy of an original image can be obtained. Multiple copies can be obtained by repeating the transfer process using appropriate coating thicknesses of the stratum, pressures and temperatures to give the desired number of copies.

The term "underexposed" as used herein is intended to cover the image areas which are completely underexposed or those exposed only to the extent that there is polymerizable compound still present in sufficient quantity that the softening temperature in the underexposed image areas remains substantially lower than that of the complementary, adjoining, coplanar exposed image areas. The term "stick temperature," as applied to either an underexposed or exposed area of a photopolymerizable stratum, means the minimum temperature at which the image area in question sticks or adheres after contact for 5 seconds under slight pressure, e.g., thumb pressure, to analytical filter paper (Schleicher & Schull analytical filter paper No. 595) and remains adhered in a layer of at least detectable thickness after separation of the analytical paper from the stratum. The term "operating temperature" means the temperature at which the operation of transferring the image from the photopolymerizable stratum to the image receptive surface is actually carried out. The operating temperature is intermediate between the stick temperature (as just defined) of the underexposed and the exposed areas of a photopolymerizable stratum and may be as low as room temperature or below.

With the ethylenically unsaturated constituent of the photopolymerizable composition there can be added non-thermoplastic polymeric compounds to give certain desirable characteristics, e.g., to improve adhesion to the base support, adhesion to the image-receptive support on transfer, wear properties, chemical inertness, etc. so long as the additive does not affect the variability of the dye absorption. Suitable compounds include polyvinyl alcohol, cellulose, anhydrous gelatin, phenolic and melamine-formaldhyde resins, etc. If desired, the photopolymerizable layers can also contain immiscible polymeric and non-polymeric organic or inorganic fillers or reinforcing agents which are essentially transparent at the wavelengths used for the exposure of the photopolymeric material, e.g., the organophilic or hydrophilic colloidal silicas, bentonites, powdered glass, colloidal carbon, as well as various types of dyes and pigments. Such materials are used in amounts varying with the desired properties of the photopolymerizable layer. The fillers are useful in improving the strength of the composition, reducing tack and, in addition, as coloring agents.

Plasticizing compounds are useful additives to the composition, particularly those which are radiation or thermally polymerizable, so long as they do not unduly affect the variability of the dye absorption. Suitable addition polymerizable ethylenically unsaturated compounds which can be used with the above-described thermoplastic polymeric compounds to form a part of the "system" include, preferably, an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Patent 2,927,022, issued March 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such hetero atoms as nitrogen, oxygen and sulfur. Outstanding are such materials wherein the ethylenically unsaturated groups, especially the vinylidene groups, are conjugated with ester or amide structures. The following specific compounds are further illustrative of this class: unsaturated esters of alcohols, preferably polyols, and particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tri- and tetramethacrylate, pentaerythritol tetraacrylate, pentaerythritol triacrylate, dipentaerythritol hexacrylate, tripentaerythritol octaacrylate, mannitol hexacrylate, sorbitol hexacrylate, inositol hexacrylate and the corresponding methacrylates, 1,3-propanediol diacrylate, 1,5-pentanediol dimethacrylate, the bis-acrylates and methacrylates of polyethylene glycols of molecular weight 200–1500, and the like; unsaturated amides, particularly those of the alpha-methylene carboxylic acids, and especially those of alpha,omega-diamines and oxygen-interrupted omega-diamines, such as methylene bisacrylamide, methylene bis-methacrylamide, ethylene bis-methacrylamide, 1,6-hexamethylene bis-acrylamide, diethylene triamine tris-methacrylamide, bis(gamma-methacrylamidopropoxy)ethane, beta-methacrylamidoethyl methacrylate, N-beta-hydroxyethyl-beta-(methacrylamido)ethyl acrylate and N,N-bis(beta-methacrylyloxyethyl)acrylamide; vinyl esters such as divinyl succinate, divinyladipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamines wherein the molecular chain between the hydroxyls and amino groups is solely carbon or oxygen-interrupted carbon. The preferred monomeric compounds are difunctional, but monofunctional monomers can be used. The amount of monomer added varies with the particular thermoplastic polymer used. The ethylenic unsaturation can also be present as an extralinear substituent attached to a linear polymer, such as polyvinyl acetate/acrylate, N-acryloxymethylpolyamide, allyloxymethylpolyamide, etc., in which case the monomer and polymer function are combined in a single material.

A preferred class of free-radical generating addition polymerization initiators activatable by actinic light and thermally inactive at and below 185° C. includes the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethyl-anthraquinone, 2-tert-butylanthraquinone, octamethyanthraquinone, 1,4-napthoquinone, 9,10-phenanthrenequinone, 1,2-benzanthraquinone, 2,3-benzanthraquinone, 2-methyl-1,4-naphthoquinone, 2,3-dichloroanthraquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, 1,2,3,4-tetrahydrobenz- [a] anthracene-7,12-dione and azo initiators. There can be used with the appropriate variably absorbing dye, the initiators in assignee's aplications to be filed on even date, i.e., Burg, Ser. No. 156,529, filed Dec. 1, 1961, and entitled "Elements, Compositions and Compounds," and Burg, Ser. No. 156,530, filed Dec. 1, 1961, and entitled "Compounds, Compositions and Elements." Also useful are certain aromatic ketones, e.g., benzophenone, which are thermally inactive at and below 185° C. Other photo-initiators which are also useful, even though some of them may be thermally active at temperatures as low as 85° C., are described in Plambeck U.S. Patent 2,760,863 and include vicinal ketaldonyl compounds, such as diacetyl, benzil, etc.; alpha-ketaldonyl alcohols, such as benzoin, pivaloin, etc.; acyloin ethers, e.g., bezoin methyl and ethyl ethers, etc.; alpha-hydrocarbon substituted aromatic acyloins, including alpha-methyl-bezoin, alpha-allylbenzoin, and alpha-phenylbenzoin.

Variably absorbing dyes useful in accordance with the invention are known and are commercially available. Suitable such dyes exhibit the phenomenon of metachromasy. This phenomenon is discussed in J. Am. Chem. Soc. 67, 1212 (1945). The preferred dyes are basic dyes. A test for a suitable basic dye is that when it is dissolved in a 3% by weight aqueous solution of sodium ribonucleate it has at least a 50% greater extinction coefficient for a given concentration of dye in a part of its intense visible spectrum than when said dye is dissolved in a 0.5% by weight aqueous solution of agar-agar. Also, the photopolymerizable layer containing the dye is characterized in that a layer 0.3 mil in thickness on a transparent film base, e.g., polyethylene terephthalate film base, containing 1% by weight of the dye based on the weight of the dry layer undergoes at least a 50% increase in extinction coefficient in one of the peak wavelength regions where the initiator absorbs actinic radiation when the dye is dissociated or deaggregated, e.g., by heating or by transfer to a suitable receptive support.

Among the suitable variably absorbing dyes useful in accordance with this invention with a suitable initiator are "Calcozine" Green (CI Basic Green 5), Thioflavine TCN (CI Basic Yellow 1), Astra Phosphine 5G (CI Basic Orange 10) and Safranine A (CI Basic Red 2).

In addition to the dyes capable of molecular association and dissociation, the photopolymerizable layers may contain other dyes which need not exhibit such properties or metachromasy, or whose main absorption is not in the actinic region. Among such additional dyes which may be present in the photopolymerizable layers are the following:

| | CI |
|---|---|
| Rhodamine 6GDN | Basic Red 1. |
| Brilliant Pink AS | Basic Red 12. |
| Safranine Bluish | Basic Violet 5. |
| Azosol Fast Black MA | Solvent Black 19. |
| Malachite Green | Basic Green 4. |
| "Pontacyl" Wool Blue BL | Acid Blue 59. |
| "Pontacyl" Wool Blue GL | Acid Blue 102. |

The photopolymerizable layers may also include suitable pigments, e.g., $TiO_2$, colloidal carbon, graphite, phosphor particles, ceramics, clays, metal powders such as aluminum, copper, magnetic iron and bronze, which should not destroy the required properties of the polymeric system. The pigments are useful when placed in the photosensitive layer or in an adjacent nonphotosensitive layer.

In making the image-yielding elements of the invention, a photopolymerizable composition as described above and a volatile solvent or diluent is coated or extruded in the form of a thin film onto the surface of a suitable support, e.g., a film base, paper, glass, metal or other support, to form a layer which, when dry, is from 0.00005 inch to 0.0005 inch in thickness. Suitable supports are described in U.S. Patent 2,791,504 and these supports may have an anchor layer or antihalation layer between the surface of the support and the photopolymerizable layer. The elements can be made by the procedures described in the aforesaid patent. Melt extrusion, solvent extrusion, reverse roll coating and skim coating techniques can be used. Doctor knives and air doctor knives can be used to form the coatings.

The image-receptive element to which the stratum is transferred must be one to which the variably absorbing basic dye will absorb with the required increase in optical density. Thus, transfer to the receptive element must cause the variably absorbing dye in the element to undergo at least a 50% increase in efficiency of absorption in a part of its intense visible spectrum. The most important examples of satisfactory image-receptive elements are any uncoated papers, e.g. bond paper. Other uncoated papers which are useful include both sized and unsized varieties such as filter paper, onion skin, tissue paper, newsprint, paper board, wrapping and bag papers, book paper, etc. Many other surfaces which are not originally useful can be made so by coating them or otherwise covering them with a layer which will give them the required properties of receiving the transferred image.

Prior to the transfer of a portion of a photopolymerizable layer in the underexposed areas, the layer is exposed to actinic radiation. This may be through a two-tone image or a process transparency, e.g., a process negative or positive (an image-bearing transparency consisting solely of substantially opaque and substantially transparent areas where the opaque areas are substantially of the same optical density, the so-called line or halftone negative or positive) or through a continuous tone negative or positive. The image or transparency may or may not be in operative contact with the layer, e.g., contact exposure or projection exposure. It is possible to expose through paper or other light-transmitting materials. A stronger radiation source or longer exposure times must be used, however.

Reflex exposure techniques are especially useful in the present invention, particularly when office copies are made. By using reflex exposure, copies can be made from materials having messages on both sides of a page or from opaque supports, e.g., paper, cardboard, metal, etc., as well as from poor light-transmitting surfaces. Right reading copies having excellent resolution are obtained directly on transfer.

The exposure sources should furnish an effective amount of visible light in the spectral region corresponding to the maximum sensitivity of the free-radical-generating addition polymerization initiator. Many of the available light sources emit radiation in both the ultraviolet and the visible region of the spectrum but it is the emission in the latter region which is required. Suitable sources include fluorescent lamps, particularly those with visible light-emitting phosphors, tungsten lamps, carbon arcs, mercury-vapor arcs, argon glow lamps, electronic flash units, photographic flood lamps and sunlight. The surfaces of the exposing lamps are customarily maintained at a distance of about zero to about 20 inches or more from the photopolymerizable layer.

After the exposure of the photopolymerizable layer, the exposed composition is brought into intimate contact with the receptive surface while heat may be simultaneously applied to effect the transfer of the underexposed areas of the photopolymerizable composition. While the heat is preferably applied simultaneously with the contact of the exposed element to the receptive support, the heat can be applied at any stage of the process prior to the separation step to either or both elements provided the transfer temperatures are intermediate between the stick temperatures of the underexposed and exposed areas of the photopolymerizable stratum. Heat can be applied by means well known to the art, e.g. rollers, flat or curved heating surfaces or platens, radiant sources, e.g., heating lamps, etc. When the stick temperature of the underexposed areas is below room temperature, no application of heat is required in the transfer process.

The operating temperature can range from room temperature to about 220° C. or more and the contact time for 0.01 to 10 seconds or more. In general about 0.1 second is adequate.

This invention will be further illustrated but is not intended to be limited by the following procedure and examples:

PROCEDURE A

The following test procedure was developed for use in determining whether or not a particular basic dye would undergo sufficient increase in extinction coefficient to be useful in accordance with this invention, using Crystal Violet (CI Basic Violet 3) as an illustration:

An aqueous solution of Crystal Violet dye was prepared by dissolving 0.005 g. of the dye in 100 ml. of water.

A stock solution of agar-agar was prepared by adding 2.78 g. of agar-agar to sufficient water to make a total volume of 500 ml. The solution was stirred at room temperature for one hour, heated to 70° C., stirred for another hour, centrifuged and the resulting soluble portion separated by decantation. The remaining solid portion was discarded.

Another stock solution was prepared by dissolving 16.7 g. of sodium ribonucleate in sufficient water to make a total volume of 500 ml. The sodium ribonucleate dissolved completely upon stirring at room temperature.

Two milliliters of the Crystal Violet dye solution were added to 18 ml. of the agar-agar stock solution and stirred thoroughly. In another vessel, 2 ml. of the Crystal Violet dye solution was added to 18 ml. of the stock solution of sodium ribonucleate and stirred thoroughly. These two resulting solutions were examined spectrophotometrically in the transmission density cell of the Cary Spectrophotometer described in Example I. At a wave length of 595 millimicrons, the solution of Crystal Violet in agar-agar had an optical density of 0.43 while the solution of Crystal Violet in sodium ribonucleate had an optical density of 0.93. Since the two solutions were at the same concentration of dye, Crystal Violet dye is seen to have far more than the 50% increase in extinction coefficient in accordance with this invention.

A number of other dyes have been tested using the procedure just described and the results of spectrophotometric examination are set forth in Table 1 which follows. In this table, the dyes were used in different concentrations. The structural formula of each of dyes L and M are given for convenience. Dye L is CI 11825 (Basic Black 2).

Dye M, however, can be prepared from CI-50240 (Basic Red 2) by diazotizing the latter dye in any conventional manner (e.g., that described in U.S. Patent No. 2,554,443, May 22, 1951) and coupling the diazotized dye with N-beta-cyanoethyl-N-ethyl-m-toluidine. The azo dye is isolated in the form of the zinc chloride salt.

*Table 1*

| Dye | Colour Index | Concentration, grams per liter | Wavelength, millimicrons | Optical Density in— | |
|---|---|---|---|---|---|
| | | | | Agar-Agar | Sodium Ribonucleate |
| Crystal Violet | CI Basic Violet 3 | $5\times10^{-3}$ | 595 | 0.43 | 0.93 |
| Astra Phosphine 5G | CI Basic Orange 10 | $2\times10^{-2}$ | 460 | 0.25 | 1.20 |
| Setoflavine T Supra | CI Basic Yellow 1 | $2\times10^{-2}$ | 440 | 0.40 | 1.19 |
| Thioflavine TCN | CI Basic Yellow 1 | $2\times10^{-2}$ | 440 | 0.40 | 1.19 |
| Carbocyanine Dye of Example II. | | $5\times10^{-3}$ | 550 | about zero | 0.18 |
| Safranine A | CI Basic Red 2 | $2\times10^{-2}$ | 540 | 0.22 | 1.27 |
| Methylene Green | CI Basic Green 5 | $5\times10^{-3}$ | 670 | 0.20 | 0.42 |
| "Sevron" Blue B | CI Basic Blue 21 | $5\times10^{-2}$ | 640 | 0.07 | 0.32 |
| "Sevron" Blue 2G | CI Basic Blue 22 | $5\times10^{-2}$ | 650 | 0.07 | 0.28 |
| Dye L | CI Basic Black [*] | $1.25\times10^{-2}$ | 600 | 0.25 | 0.48 |
| Dye M | [**] | $5\times10^{-2}$ | 600 | 0.25 | 0.59 |

[*]

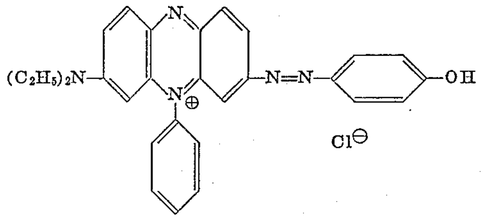

[**]

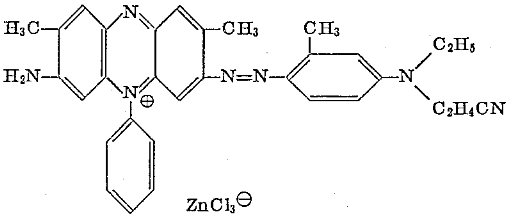

EXAMPLE I

The following solution was prepared:

| | G. |
|---|---|
| Polyethylene glycol diacrylate | 90 |
| Cellulose acetate butyrate | 60 |
| Acetone | 350 |

The above ingredients were mixed in a high speed blending mixer of the type shown in Osius U.S. Patent 2,109,501 (Waring Corporation, New York, N.Y.) for 10 minutes and then brought up to a weight of 535 g. with acetone. The cellulose acetate butyrate contained about 20.5% acetyl groups, about 26% butyryl and about 2.5% hydroxyl groups and had a viscosity of 9 to 13.5 poises as determined by A.S.T.M. method D–1343 in solution described as Formula A, A.S.T.M. method D-871-54 T. The polyethylene glycol diacrylate was derived from polyethylene glycol with an average molecular weight of 300.

Another solution was prepared by adding 0.02 g. Thioflavine TCN dye (CI Basic Yellow 1) to 4 ml. ethanol and bringing to a boil for about 1 second. Two ml. acetone were added to the solution which was again brought to a boil for about 1 second, cooled and centrifuged for 5 minutes. The supernatant liquid was decanted into a vessel containing 13.3 g. of the cellulose acetate butyrate/polyethylene glycol diacrylate solution prepared as described in the paragraph above. Acetone was added to bring the total solution weight to 20 g. After a thorough mixing, the solution was coated on an untreated 1-mil thick polyethylene terephthalate film support. The coating was dried in air at room temperature and their resulted a 0.0004 inch thick layer which was tacky to the touch but which could not be transferred at room temperature.

A 3 x 5-inch sample of the coating was placed in contact with a like-sized sheet of bond paper and the superposed elements were passed through pressure rollers at 120° C. and 6 lbs. of force per lineal inch of the rollers. In this operation, which is referred to as "hot pressing," a part of the polymerizable coated stratum was transferred to a receptive uncoated paper support and it could be seen readily that the dye within the stratum underwent an appreciable increase in efficiency of absorption in a part of its intense visible spectrum. The transferred stratum appeared as a deep yellow as compared with the pale yellow appearance of the coating before transfer by "hot pressing."

Quantitive data were obtained by means of reflection spectrophotometry, using the Cary Recording Spectrophotometer, Model 14 MS, Serial No. 14, manufactured by Applied Physics Corporation, Pasadena, California. A reference standard consisted of a piece of bond paper identical with that serving as the receptive surface above, over which was placed a piece of 1-mil thick polyethylene terephthalate film identical with that used above as the coating support. Using this same reference standard, curves of spectral reflectivity were obtained of the sample of coating which was "hot pressed" to bond paper and of another sample of the coating which was not "hot pressed" but merely held in contact with a piece of bond paper. The "hot pressed" sample showed a peak absorption at 420 millimicrons with an optical density of 0.43 as compared with an optical density at this same wave length of 0.21 for the sample which had not been "hot pressed."

EXAMPLE II

Example I was essentially repeated except that instead of Thioflavine TCN the following dyes were used in twice the concentration of the dye:

| Dye Symbol: | Dye |
|---|---|
| A | "Calcozine" Green (CI Basic Green 5). |
| B | Phosphine GG (CI Basic Orange 10). |
| C | Safranine A (CI Basic Red 2). |
| D | 3,3' - diethyl-5-5'-dibromo-9-methyl thiacarbocyanine p-toluene sulfonate. |

Coatings were made as described in Example I of each of the above dyes. Spectral reflectivity data were obtained from samples of each of these coatings to determine the effect of "hot pressing." The results are shown in the table below:

*Table 2*

| Dye | Wavelength (millimicrons) | Optical Density | |
|---|---|---|---|
| | | "Hot Pressed" | Raw Stock Film |
| A | 655 | .41 | .15 |
| B | 460 | .33 | .13 |
| C | 520 | .72 | .41 |
| D | 560 | .95 | .31 |

Examples I and II do not completely exemplify the invention but describe dyes exhibiting metachromasy. These dyes are to be used with an appropriate initiator active at a wave length at which the dye undergoes a change in optical density.

EXAMPLE III

A cellulose acetate butyrate/polyethylene glycol diacrylate solution was made up as described in Example I. A mixed dye solution was then prepared by adding to 8 ml. of ethanol the following dyes:

| | G. |
|---|---|
| Thioflavine TCN (CI Basic Yellow 1) | 0.04 |
| Astra Phosphine 5G (CI Basic Orange 10) | 0.04 |
| Rhodamine 6GDN (CI Basic Red 1) | 0.02 |
| Victoria Pure Blue BO (CI Basic Blue 7) | 0.03 |

The above dye solution was brought to a boil for about 1 second and 4 ml. of acetone was added. The solution was again brought to a boil for about 1 second and centrifuged for five minutes.

The centrifuged dye solution was decanted into a vessel containing 26.6 g. of the cellulose acetate butyrate/polyethylene glycol diacrylate solution prepared as described above and to this solution were added 0.08 g. of 9,10-phenanthrenequinone and 0.02 g. of p-methoxyphenol. The solution was brought to a final weight of 40 g. with acetone, then coated under subdued lighting on 0.001 inch thick polyethylene terephthalate film base and, after drying to a thickness of 0.0003 inch, a similar sheet of polyethylene terephthalate film base was placed in uniform surface contact with the coating by pressing at room temperature with a rubber squeegee. This temporary lamination serves to decrease the inhibiting effect of oxygen on photopolymerization which constitutes the subject matter of the invention of assignee's copending application Heiart U.S. Ser. No. 81,377, filed Jan. 9, 1961. The coated and laminated element thus prepared had a blue color. A sample of the element was placed in contact with an "original" consisting of a sheet of white paper containing a message typed in black ink. The cover sheet of the coated element was in contact with the image side of the typed paper. A reflectographic exposure was made by exposing through the support of the coated element in a Rotolite Model #18 White Printing Machine (Rotolite Sales Corp., P.O. Box 7, Stirling, N.J.) equipped with a standard blue fluorescent lamp. Speed of the machine was such that the entire area of the element received a 3-second exposure to light. After exposure, the element was delaminated and hot pressed to bond paper as described in Example I. While still hot, the matrix (polyethylene terephthalate film base with adhering polymerizable material) was stripped off to leave a blue-black positive copy of the original image on the surface of the bond paper. By repeating the hot pressing procedure, a second clear copy was made, similar in appearance to the first copy.

Without exposure, a sample of a similar coating, but which contained no phenanthrenequinone or p-methoxyphenol, was examined spectrophotometrically as described in Example I, with and without "hot pressing." The "hot pressed" samples showed peaks at 365 millimicrons of 0.53 optical density and at 450 millimicrons of 0.70 optical density. The sample which was not "hot pressed" had optical densities of 0.34 and 0.49, respectively, at corresponding wavelengths. The spectrophotometric curves of the "hot pressed" and "non-hot pressed" samples were substantially identical at wave length above 520 millimicrons. This coating contained two dyes which absorbed chiefly in the region of the spectrum of wave lengths greater than 520 millimicrons which were not variably absorbing and two dyes which absorbed in the blue region of the spectrum and which did possess properties of variable absorption. Thus, the color shifted from blue to blue-black as the blue-absorbing dyes increased in optical density upon "hot pressing."

EXAMPLE IV

A solution of Safranine A (CI Basic Red 2) dye was prepared by adding 0.6 g. of the dye to 80 ml. ethanol, bringing to a boil, adding 40 ml. acetone, boiling momentarily, filtering and bringing up to 100 g. with acetone. Five grams of this dye solution were added to a solution containing 13.3 g. of the cellulose acetate butyrate/polyethylene glycol diacrylate solution prepared as described in Example I and 0.01 g. of an addition polymerization initiator of the formula:

which has a visible adsorption peak at 500 millimicrons. The solution was brought up to 20 g. with acetone and coated, dried, and laminated as in Example III. A sample of this coating was exposed through a transparency bearing a line image to a carbon arc at a distance of 15 inches for one minute, the radiation from the arc being required to pass through a Wratten 2A filter which has an optical density of at least 3.0 at wavelengths below 400 millimicrons. After exposure, the cover sheet was removed, a bond paper sheet was hot pressed against the exposed and non-exposed surface areas and the paper sheet removed as described in Example III to leave a clear pink positive copy on the paper sheet. The image density of the copy was markedly higher than the density of the untransferred coating.

The above coating was essentially duplicated except for the omission of the azo initiator from a coating composition. Under identical testing conditions, except that the filter was not used, there occurred a uniform transfer of the coating composition to the bond receptor paper so that the latter had a uniform pink coloring. Thus, in the absence of an initiator, it was apparent that no polymerization had occurred. From these two tests, it was evident that the azo initiator was active in the visible region of the spectrum, i.e., above 400 millimicrons. This is also the region of principal absorption of the Safranine A dye (absorption peak near 500 millimicrons) both in the molecularly aggregated and in the molecularly deaggregated forms.

EXAMPLE V

Eight-tenths of a gram of Astra Phosphine 5G (Basic Orange 10) was added to 80 ml. of ethanol. The mixture was brought to a boil, 40 ml. of acetone was added, the mixture was again boiled, then filtered, and the filtrate brought up to a weight of 100 g. with acetone. Five grams of the dye solution thus prepared was added to a solution containing 13.3 g. of the polyethylene glycol diacrylate/cellulose acetate butyrate solution prepared as in Example I and 0.05 g. of an addition polymerization initiator prepared as described in Procedure A of assignee's related application, Burg U.S. Ser. No. 156,529, filed Dec. 1, 1961, and having the formula:

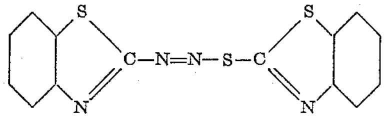

The solution was brought up to a weight of 20 g. with acetone, coated and a transparent cover sheet applied as in Example IV. Exposures were made as in Example IV except for the time of exposure which was only 2 seconds. One sample was exposed through a Wratten 2A filter while another sample of the coating was exposed in the absence of this filter. On transferring by hot pressing as in Example IV, clear yellow positive copies (of markedly higher density than the untransferred coating) of the original image were obtained on the bond paper supports. Since it was impossible to detect any difference between the two copies, it was concluded that the use of an ultraviolet filter in making the exposure had no effect on the outcome.

EXAMPLE VI

A dye solution was made up containing the following:

| | | |
|---|---|---|
| Ethanol | ml. | 32 |
| Dye E | g. | 0.32 |
| Dye F | g. | 0.16 |
| Dye G | g. | 0.12 |
| Dye H | g. | 0.12 |
| Dye I | g. | 0.12 |

The above dyes were added to the ethanol, the mixture brought to a boil, and 16 ml. acetone was added. The mixture was again brought to a boil, centrifuged 5 minutes,, decanted and the solution resulting was brought up to 40 g. with acetone.

In the above dye solution, Dye E is the reaction product of an equimolar mixture of Thioflavine TCN (CI Basic Yellow 1) and m-benzene disulfonic acid; Dye F is Astra Phosphine 5G (CI Basic Orange 10); Dye G is the reaction product of an equimolar mixture of Rhodamine G (CI Basic Red 8) and "Luxol" Fast Blue MBSN (CI Solvent Blue 38); Dye H is crystal violet (CI Basic Violet 3), and Dye I is the reaction product of an equimolar mixture of Victoria Pure Blue BO (CI Basic Blue 7) and "Luxol" Fast Blue MBSN (CI Solvent Blue 38).

Two grams of a commercially available polymethyl methacrylate resin powder having a heat distortion temperature of 216° F. at 66 lbs. per sq. inch was dissolved in 10 g. of acetone and to this solution were added 2.0 g. of polyethylene glycol diacrylate, 0.04 g. of phenanthrenequinone, 0.01 g. of p-methoxyphenol, 5.0 g. of the 5-component dye solution prepared as described above and sufficient acetone to bring the total solution weight to 20 g. The solution was coated, laminated, exposed reflectographically and hot pressed to bond paper as in Example III giving a clear blue-black positive copy on a bond paper support of the original image. The coating itself was blue, the color change to blue-black occurring on hot pressing to the bond paper support.

The above proledure was essentially repeated except for the substitution of another commercially available polymethyl methacrylate resin molding powder having a heat distortion temperature of 190° F. at 66 lbs. per sq. inch. Again, the procedure was essentially repeated except for the substitution of a third commercially available polymethyl methacrylate resin molding powder having a heat distortion temperature of 175° F. at 66 lbs. per sq. inch. Very similar results were obtained with the substitution of these other resin molding powders which served as binders for the other ingredients in the coating solutions.

EXAMPLE VII

A stock binder-polymerizable monomer solution was made by adding to 310 g. of acetone, 24 g. of cellulose acetate having 39.4% acetyl groups and having an ASTM viscosity of 45, 96 g. polyethylene glycol diacrylate and 40 g. cellulose acetate butyrate (as described in Example I). The mixture was stirred at room temperature in a high-speed blending mixer, as in Example I, until dissolved. To 12.7 g. of this stock solution there were added 0.04 g. of phenanthrenequinone, 0.01 g. of p-methoxyphenol, 5.0 g. of a dye solution to be described below and sufficient acetone to bring the solution to a total weight of 20 g.

The dye solution used above was prepared by adding to 6 ml. ethanol, 0.02 g. of a dye prepared by the reaction of an equimolar amount of Thioflavine TCN (CI Basic Yellow 1) and m-benzene disulfonic acid; 0.02 g. of "Sevron" Orange G (CI Basic Orange 21); and 0.03 g. of the reaction product from the following mixture:

1 mole Victoria Pure Blue BO (CI Basic Blue 7)
0.7 mole Crystal Violet (CI Basic Violet 3)
1 mole Rhodamine 5G (Basic Dye CI No. 45105) with 1 mole Solvent Blue 38 ("Luxol" Fast Blue MBSN)

The above dye solution was prepared by bringing to a boil, centrifuging for 3 minutes and discarding the precipitate.

The solution containing the binder, monomer, initiator, inhibitor and dye was coated on 0.001 inch-thick polyethylene terephthalate base to a dry coating thickness of 0.0003 inch. The coating was then laminated, exposed, and transferred to a bond paper receptor sheet as in Example III. Again, a blue coating yielded, on hot transfer, a clear blue-black positive copy on the bond paper support.

EXAMPLE VIII

A solution was prepared containing the following ingredients, stirring with an air motor at room temperature until complete solution was obtained:

| | G. |
|---|---|
| Cellulose acetate | 6 |
| Cellulose acetate butyrate | 10 |
| Pentaerythritol tetraacrylate | 18 |
| Triethylene glycol diacrylate | 6 |
| Acetone | 100 |

The first two ingredients of this solution were as described in the preceding example.

To 14.1 g. of the above-described solution there were added 0.04 g. of phenanthrenequinone, a mixed dye solution to be described and sufficient acetone to bring the total weight of solution to 20 g. The mixed dye solution was made by stirring the following at room temperature, then boiling momentarily, cooling, centrifuging and discarding the precipitate:

6.0 ml. ethanol
0.015 g. of the reaction product from the reaction of an equimolar mixture of Thioflavine TCN (CI Basic Yellow 1) and m-benzene disulfonic acid
0.005 g. of "Sevron" Orange G (CI Basic Orange 21)
0.03 g. of the four-dye-component reaction product described in Example VII.

The solution was coated, laminated, exposed, delaminated, and hot pressed to bond paper as in Example III, giving a clear blue-black positive copy of the original image. The coating itself was blue in color but hot pressing to the bond paper support caused a color change (or change in optical density in the short wavelength region of the visible spectrum).

EXAMPLE IX

Dye solution J contained 0.02 g. Thioflavine TCN (CI Basic Yellow I) and 5.0 ml. of ethanol.

Dye solution K contained 5.0 ml. ethanol and the following dyes:

0.015 g. of the reaction product from the reaction of an equimolar mixture of Thioflavine TCN (CI Basic Yellow I) and m-benzenedisulfonic acid.
0.008 g. "Sevron" Orange G (CI Basic Orange 21)
0.03 g. of the four-component reaction mixture of dyes as described in Example VII Dye solutions J and K were prepared by the usual method of bringing to a boil, centrifuging five minutes, and discarding the precipitates.

A coating solution was prepared by mixing together 4.0 g. of acetone, 4.5 g. of a 17.7% by weight acetone solution of cellulose acetate butyrate (of the type described in Example I), 3.2 g. of polyethylene glycol diacrylate (derived from polyethylene glycol with an average molecular weight of 300), 0.04 g. of phenanthrenequinone, 0.01 g. p-methoxyphenol, dye solution J and acetone to bring the total solution weight to 20 g. A similar coating solution was prepared in which dye solution K was substituted for dye solution J. Coatings of these solutions were made as described in Example I. The coatings, when dried, were tacky at room temperature since, as it may be noted, the ratio of polymerizable monomer (polyethylene glycol diacrylate) to the polymeric binder (cellulose acetate butyrate) was 4:1. If there were a preponderance of polymer instead of monomer, there would be no such tackiness at room temperature.

The two coatings were laminated and exposed through a transparency negative in the apparatus as described in Example III with exposure times of 12.5 seconds. After delamination, the coatings were contacted with bond paper and passed between two pressure bars at room temperature at a pressure of 2.2 lbs./lineal inch. The first coating (containing dye solution J) was originally a very pale yellow but, after transfer by pressing at room temperature to the receptor sheet and stripping off the matrix, a clear bright yellow positive copy of the original image was obtained. The second coating (containing dye solution K) was originally blue in color but, after room temperature pressing to the bond paper support, a clear blue-black positive copy of the original image was obtained.

EXAMPLE X

A coating solution was prepared by mixing together 4.0 g. of acetone, 5.7 g. of a 17.7% by weight acetone solution of cellulose acetate butyrate (of the type described in Example I), 3.0 g. of polyethylene glycol diacrylate (derived from polyethylene glycol with an average molecular weight of 300), 0.04 g. phenanthrenequinone, 0.01 g. p-methoxyphenol dye solution K (prepared as described in Example IX) and sufficient acetone to bring the total solution weight to 20 g. The solution was coated, dried, laminated, exposed through a transparency negative, delaminated and imagewise transferred to bond paper as in Example IX except that the particular exposure conditions used for this coating were 25.5 seconds and the image transfer was at a roller pressure of 2.2 pounds per lineal inch at a temperature of 90° C. Another piece of the same coating was treated similarly except that transfer was made, not to bond paper, but to the matte surface of drafting film as described in Example I of Van Stappen U.S. 2,946,423. A higher transfer temperature (160° C.) was employed. In both cases, the blue coatings transferred as clear blue-black positive copies on the receptive supports.

EXAMPLE XI

Another sample of the second coating of Example X (containing dye solution K) was exposed in the same manner, delaminated and pressed against bond paper through pressure bars as previously described. In this instance, the matrix (original support for the coating plus that part of the coating which did not transfer to the receptor surface) was allowed to remain in contact with the receptor surface rather than being stripped away as in the previous example. The change in covering power of the yellow dye (Thioflavine TCN–CI Basic Yellow 1) caused a blue-black positive copy of the original image to appear in a blue background, the black image appearing where the soft, unexposed areas were pressed into the paper support.

EXAMPLE XII

To each of four vessels there was added 14.1 g. of the stock binder/monomer solution described in the first paragraph of Example VIII, and 0.04 g. of phenanthrenequinone, and may contain 0.01 g. of p-methoxyphenol. To vessel No. 1 there was added a dye solution prepared by momentarily boiling 0.04 g. of Sevron Blue B dye (CI Basic Blue 21) in 6 ml. of methanol, cooling, centrifuging and discarding the precipitate. Similar dye solutions prepared from 0.04 g. of Sevron Blue 2G dye (CI Basic Blue 22), 0.04 g. of Dye M and 0.01 g. of Dye L were added, respectively, to vessels No. 2, 3 and 4. Formulae of Dyes L and M were given in Table 1 in Procedure A. The solutions in each vessel were brought up to a weight of 20 g. with acetone, then coated and laminated as described in Example III.

A 3 x 5-inch sample of each coating was delaminated, then transferred by hot pressing to bond paper receptor sheets as described in Example I. The receptor sheets, along with delaminated "rawstock" samples of each coating (samples which had not undergone hot pressing) were all exposed for 30 seconds in a "Rotolite" printing machine as described in Example III, so as to bleach the phenanthrenequinone. Reflection spectra for the four rawstock coatings and the four hot pressed receptor sheets were recorded as follows:

| Coating | Dye | Wave-lenght, milli-microns | Optical Densities | |
|---|---|---|---|---|
| | | | Raw Stock | Hot Pressed |
| No. 1 | Basic Blue 21 | 620 | 0.16 | 0.28 |
| No. 2 | Basic Blue 22 | 640 | 0.17 | 0.29 |
| No. 3 | Dye M | 460 | 0.12 | 0.23 |
| No. 4 | Dye L | 600 | 0.30 | 0.53 |

A reflex exposure of a sample of Coating No. 4 to an "original" as described in Example III gave a clear grey copy that appeared to the eye as a nearly perfect neutral color.

EXAMPLE XIII

Coatings were prepared and laminated as described in Example XII except that, instead of a single dye, they contained the following dye combinations:

Coating No. 5: 0.01 g. Dye L+0.04 g. Dye M
Coating No. 6: 0.02 g. Dye L+0.04 g. "Pontacyl" Wool Blue BL (CI Acid Blue 59)

Reflex exposures as described in Example II gave excellent blue-black positive copies.

The following polymeric materials were found to be satisfactory binders for the variably absorbing basic dyes exhibiting metachromasy and used in accordance with this invention:

(A) Cellulose acetate butyrate (as described in Example I.
(B) Polyisobutyl methacrylate having, at 25° C., a density of 1.05, a refractive index of 1.477 and a tensile strength (ASTMD 638–49R) of 3600 pounds per sq. in.

(C) "Butvar" polymer, registered trade name, Shawinigan Resin Corp., defined by Haynes, Chemical Trade Names and Commercial Synonyms, 2nd Edition (1955) as "polyvinyl butyral resin."

(D) Vinylidene chloride/acrylonitrile, 80/20 copolymer.

(E) Water-soluble, low viscosity, low molecular weight polyacrylic acid, commercially available as a 25% by weight aqueous solution.

(F) Polyvinyl acetate which, dissolved in benzene in a concentration of 86 g. per liter of solution, has a viscosity of 90–110 centipoises at 20° C.

(G) High molecular weight polyethylene oxide having a melt viscosity of 15,000–16,000 poises at 150° C. and, in a 5% by weight aqueous solution, having a viscosity of 225–375 poises at 25° C.

(H) Ethyl cellulose containing 48% ethoxy groups and having a viscosity of 4.5 centipoises at 25° C. in a 5% by weight solution in 80:20 toluene:ethanol.

(I) A copolyester from a reaction mixture comprising ethylene glycol with an 8:1:1 mole ratio, respectively of dimethyl hexahydroterephthalate, dimethyl sebacate and dimethyl terephthalate, prepared as described in Example 5 of assignee's copending application, U.S. Ser. No. 718,410 filed Mar. 3, 1958.

The polymers designated by letters A–I above were each dissolved in appropriate solvents, mixed with 4 ml. of a variably absorbing dye solution containing 0.04 g. of a variably absorbing dye and 1.5 of polyethylene glycol diacrylate, and the resulting solution brought to a total volume of 20 ml. with acetone, coated, and a sample of the coating hot pressed and examined spectrophotometrically as described in Example I (for cellulose acetate/polyethylene glycol diacrylate polymeric system). Results are tabulated below, showing the increase in efficiency of absorption of the dye, coated with the various polymeric systems described above, and then hot pressed to a receptive surface of bond paper. Readings of optical density were taken at the wave lengths indicated.

*Optical density*

| Polymeric System | Raw Stock | Hot Pressed | Wavelength (millimicrons) |
|---|---|---|---|
| A | 0.23 | 0.85 | 640 |
| B | 0.27 | 0.74 | 660 |
| C | 0.35 | 0.65 | 580 |
| D | 0.49 | 0.76 | 560 |
| E | 0.26 | 0.40 | 520 |
| F | 0.18 | 0.57 | 660 |
| G | 0.22 | 0.33 | 660 |
| H | 0.22 | 0.85 | 660 |
| I | 0.22 | 0.65 | 660 |

In the above examples, the abbreviation CI refers to the Colour Index, 2nd Edition, 1956, The Society of Dyers and Colourists, Dean House, Picadilly, Bradford, Yorkshire, England, and The American Association of Textile Chemists and Colorists, Lowell Technological Institute, Lowell, Massachusetts, U.S.A.

A very particular advantage of this invention is illustrated in Example III wherein a transparent support was coated with a stratum containing a mixture of dyes which had low absorption in the short wavelength region of the visible spectrum but which had high absorption in the rest of the visible spectrum. Thus, the stratum could be polymerized by exposure to a source rich in short wave length visible light without problems of interference with the exposure by dye absorption. Upon transfer by hot pressing to a normally stainable receptive surface, however, the dyes underwent a change such that they absorbed light strongly throughout the entire visible spectrum and made it possible to obtain a blue-black image of high optical density. Such an element would be especially useful in the office copy field, particularly for making copies by reflectographic exposure. Simple processes and equipment can be envisioned for using these elements which are economically attractive. Furthermore, dyes are available which are capable of yielding stable and permanent images of high quality. Another advantage is the lack of criticality of the receptive surface; any readily available, uncoated paper will serve satisfactorily. The ease of making multiple copies is still another advantage. Yet another advantage is the availability of light sources which can be used, conveniently and economically, to make imagewise exposures of the photopolymerizable stratum.

Many other uses can be visualized for elements coming within the scope of this invention.

We claim:

1. A photopolymerizing element comprising a support bearing a solid uniform photopolymerizable layer having a thickness of 0.00005 to 0.005 inch of a photopolymerizable composition comprising:

(1) an addition polymerizable non-gaseous, ethylenically unsaturated compound containing at least one terminal ethylenic group having a boiling point above 100° C. at normal atmospheric pressure and being capable of forming a high polymer by free-radical initiated chain-propagating addition polymerization, (2) a free-radical generating addition polymerization initiator activatable by actinic radiation, (3) at least one variably absorbing basic dye which exhibits metachromasy and is present in molecularly associated form said dye being characterized in that it can exist in molecularly associated and dissociated form, and that upon molecular dissociation the extinction coefficient increases by at least 50% in one of the wavelength regions of intense dye absorption and where said initiator absorbs actinic radiation, and further characterized in that it assumes a molecularly associated form when dissolved in a 0.5% by weight aqueous solution of agar-agar and a molecularly dissociated form when dissolved in a 3% by weight solution of sodium ribonucleate, and (4) a compatible viscosity modifying agent.

2. A photopolymerizable element comprising a flexible sheet bearing a solid uniform photopolymerizable layer having a thickness of 0.00005 to 0.005 inch of a photopolymerizable composition comprising:

(1) an addition polymerizable, non-gaseous, ethylenically unsaturated compound containing at least one terminal ethylenic group having a boiling point above 100° C. at normal atmospheric pressure and being capable of forming a high polymer by free-radical initiated chain-propagating addition polymerization, (2) a free-radical generating addition polymerization initiator activatable by actinic radiation, (3) at least one variably absorbing basic dye which exhibits metachromasy and is present in molecularly associated form, said dye being characterized in that it can exist in molecularly associated and dissociated form, and that upon molecular dissociation the extinction coefficient increases by at least 50% in one of the wavelength regions of intense dye absorption and where said initiator absorbs actinic radiation, and further characterized in that it assumes a molecularly associated form when dissolved in a 0.5% by weight aqueous solution of agar-agar and a molecularly dissociated form when dissolved in a 3% by weight aqueous solution of sodium ribonucleate, and (4) a compatible viscosity modifying agent.

3. An element according to claim 2 wherein said modifying agent is a thermoplastic compound solid at 50° C.

4. An element according to claim 2 wherein said modifying agent is a thermoplastic organic compound solid at 50° C.

5. An element according to claim 2 wherein said modifying agent is a thermoplastic organic polymeric compound solid at 50° C.

6. An element according to claim 2 wherein constituents (1) and (4) are present in amounts from 97 to 3 and 3 to 97 parts by weight and constituents (2) and (3) are present in amounts from 0.001% to 10% and 0.01% to 10%, respectively, by weight of constituents (1) and (4).

7. A process which comprises exposing with actinic radiation, imagewise, a solid uniform stratum of a photopolymerizable composition comprising:

(1) an addition polymerizable, non-gaseous, ethylenically unsaturated compound containing at least one terminal ethylenic group having a boiling point above 100° C. at normal atmospheric pressure and being capable of forming a high polymer by free-radical initiated chain-propagating addition polymerization, (2) a free-radical generating addition polymerization initiator activatable by actinic radiation, and (3) at least one variably absorbing basic dye which exhibits metachromasy and is present in molecularly associated form said dye being characterized in that it can exist in molecularly associated and dissociated form, and that upon molecular dissociation the extinction coefficient increases by at least 50% in one of the wavelength regions of intense dye absorption and where said initiator absorbs actinic radiation, said dye being further characterized in that it assumes a molecularly associated form when dissolved in a 0.5% by weight aqueous solution of agar-agar and a molecularly dissociated form when dissolved in a 3% by weight solution of sodium ribonucleate;

until polymerization with an increase in stick temperature takes place in the exposed areas with substantially less polymerization and less increase in stick temperature in the underexposed complementary coplanar image areas to provide a difference of at least 10° C. in the stick temperatures of said exposed and underexposed areas.

8. A process which comprises exposing with actinic radiation, imagewise, a solid uniform stratum of a photopolymerizable composition comprising:

(1) an addition polymerizable non-gaseous, ethylenically unsaturated compound containing at least one terminal ethylenic group having a boiling point above 100° C. at normal atmospheric pressure and being capable of forming a high polymer by free-radical initiated chain-propagating addition polymerization, (2) a free-radical generating addition polymerization initiator activatable by actinic radiation, (3) at least one variably absorbing basic dye which exhibits metachromasy and is present in molecularly associated form said dye being characterized in that it can exist in molecularly associated and dissociated form, and that upon molecular dissociation the extinction coefficient increases by at least 50% in one of the wavelength regions of intense dye absorption and where said initiator absorbs actinic radiation, said dye being further characterized in that it assumes a molecularly associated form when dissolved in a 0.5% by weight aqueous solution of agar-agar and a molecularly dissociated form when dissolved in a 3% by weight aqueous solution of sodium ribonucleate, and (4) a compatible viscosity modifying agent;

until polymerization with an increase in stick temperature takes place in the exposed areas without substantial polymerization and an increase in stick temperature in the underexposed complementary coplanar image areas.

9. A process according to claim 8 wherein constituents (1) and (4) are present in amounts from 97 to 3 and 3 to 97 parts by weight and constituents (2) and (3) are present in amounts from 0.001% to 10% and 0.01% to 10%, respectively, by weight of constituents (1) and (4).

10. A process which comprises (A) exposing with actinic radiation, imagewise, a solid uniform stratum of a photopolymerizable composition comprising:

(1) an addition polymerizable non-gaseous, ethylenically unsaturated compound containing at least one terminal ethylenic group having a boiling point above 100° C. at normal atmospheric pressure and being capable of forming a high polymer by free-radical initiated chain-propagating addition polymerization, (2) a free-radical generating addition polymerization initiator activatable by actinic radiation, and (3) at least one variably absorbing basic dye which exhibits metachromasy and is present in molecularly associated form said dye being characterized in that it can exist in molecularly associated and dissociated form, and that upon molecular dissociation the extinction coefficient increases by at least 50% in one of the wavelength regions of intense dye absorption and where said initiator absorbs actinic radiation, said dye being characterized in that it assumes a molecularly associated form when dissolved in a 0.5% by weight aqueous solution of agar-agar and a molecularly dissociated form when dissolved in a 3% by weight aqueous solution of sodium ribonucleate, (B) placing the exposed stratum in contact with an image-receptive support and heating the contacting elements, whereby underexposed, unhardened image areas of said stratum are transferred to said support, and (C) separating the image-receptive support from said stratum.

11. A process according to claim 10 wherein said image-receptive support is a paper sheet.

References Cited by the Examiner

UNITED STATES PATENTS

| | | | |
|---|---|---|---|
| 2,760,863 | 8/56 | Plambeck | 96—115 |
| 3,047,422 | 7/62 | Sites et al. | 96—115 |
| 3,060,022 | 10/62 | Duerr | 96—28 |
| 3,060,023 | 10/62 | Berg et al. | 96—28 |
| 3,060,024 | 10/62 | Berg et al. | 96—28 |
| 3,060,025 | 10/62 | Berg et al. | 96—28 |
| 3,060,026 | 10/62 | Heiart | 96—28 |

OTHER REFERENCES

Michaelis et al.: J. Am. Chem. Soc., vol. 67, pp. 1212 to 1219 (1945).

NORMAN G. TORCHIN, *Primary Examiner.*

UNITED STATES PATENT OFFICE
CERTIFICATE OF CORRECTION

Patent No. 3,198,633 August 3, 1965

Abraham Bernard Cohen et al.

It is hereby certified that error appears in the above numbered patent requiring correction and that the said Letters Patent should read as corrected below.

Column 4, line 33, for "aplications" read -- applications --; column 5, line 28, for "0.0005" read -- 0.005 --; column 13, line 72, for "2,946,423" read -- 2,964,423 --; column 18, lines 55 to 57, for "Berg et al.", each occurrence, read -- Burg et al. --.

Signed and sealed this 5th day of Arpil 1966.

SEAL)
ttest:

RNEST W. SWIDER
ttesting Officer

EDWARD J. BRENNER
Commissioner of Patents